United States Patent
Cho (10) Patent No.: US 12,340,836 B2
(45) Date of Patent: Jun. 24, 2025

(54) MEMORY DEVICE FOR PERFORMING READ PROTECTION OPERATION OF LIMITING READ OPERATION AND METHOD OF OPERATING THE SAME

(71) Applicant: SK hynix Inc., Icheon-si (KR)

(72) Inventor: Byung Goo Cho, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 190 days.

(21) Appl. No.: 18/192,938

(22) Filed: Mar. 30, 2023

(65) Prior Publication Data

US 2024/0153546 A1 May 9, 2024

(30) Foreign Application Priority Data

Nov. 8, 2022 (KR) ........................ 10-2022-0147844

(51) Int. Cl.
| | | |
|---|---|---|
| *G11C 11/40* | (2006.01) | |
| *G11C 11/4072* | (2006.01) | |
| *G11C 11/4078* | (2006.01) | |
| *G11C 11/4093* | (2006.01) | |

(52) U.S. Cl.
CPC ...... *G11C 11/4078* (2013.01); *G11C 11/4072* (2013.01); *G11C 11/4093* (2013.01)

(58) Field of Classification Search
CPC ............ G11C 11/4078; G11C 11/4072; G11C 11/4093
See application file for complete search history.

(56) References Cited

U.S. PATENT DOCUMENTS

| | | | | |
|---|---|---|---|---|
| 7,692,984 | B2 * | 4/2010 | Roohparvar | G11C 29/88 365/189.14 |
| 8,199,604 | B2 * | 6/2012 | Wang | G11C 16/12 365/233.5 |
| 11,132,247 | B2 * | 9/2021 | Rori | G06F 12/0246 |
| 2009/0013134 | A1 | 1/2009 | Chen et al. | |
| 2022/0392562 | A1 * | 12/2022 | Hung | G11C 29/886 |

FOREIGN PATENT DOCUMENTS

KR         102095614 B1      4/2020

* cited by examiner

*Primary Examiner* — Vanthu T Nguyen
(74) *Attorney, Agent, or Firm* — WILLIAM PARK & ASSOCIATES LTD.

(57) ABSTRACT

Provided herein may be a memory device and a method of operating the same. The memory device may include a memory cell array including a plurality of memory blocks, a peripheral circuit configured to perform a read operation of reading data stored in selected memory cells in a target block among the plurality of memory blocks, and a read protection controller configured to control the peripheral circuit to perform a read protection operation of limiting the read operation on memory blocks, among the plurality of memory blocks, corresponding to a read protection command received from a memory controller.

17 Claims, 8 Drawing Sheets

MEMORY DEVICE FOR PERFORMING READ PROTECTION OPERATION OF LIMITING READ OPERATION AND METHOD OF OPERATING THE SAME

CROSS-REFERENCE TO RELATED APPLICATION

The present application claims priority under 35 U.S.C. § 119(a) to Korean patent application number 10-2022-0147844 filed on Nov. 8, 2022, in the Korean Intellectual Property Office, the entire disclosure of which is incorporated by reference herein.

BACKGROUND

1. Technical Field

Various embodiments of the present disclosure relate to a semiconductor device, and more particularly to a memory device and a method of operating the memory device.

2. Related Art

A storage device may be a semiconductor device that stores data under the control of a host, such as a mobile phone, a smartphone, an MP3 player, a laptop computer, a desktop computer, a game console, a display device, a tablet personal computer (PC), or an in-vehicle infotainment system. The storage device may include a memory device in which data is stored and a memory controller which controls the memory device. Memory devices are classified into a volatile memory device and a nonvolatile memory device.

The nonvolatile memory device may be a memory device in which stored data is retained even when the supply of power is interrupted. Examples of the nonvolatile memory device may include a read only memory (ROM), a programmable ROM (PROM), an electrically programmable ROM (EPROM), an electrically erasable and programmable ROM (EEPROM), and a flash memory.

A storage device may store user data and may read the stored data and provide the read data to a host in response to a request received from the host. The storage device may perform an operation of blocking access to user data and protecting the user data for security reasons or in response to an access blocking request or the like.

SUMMARY

An embodiment of the present disclosure may provide for a memory device. The memory device may include a memory cell array including a plurality of memory blocks, a peripheral circuit configured to perform a read operation of reading data stored in selected memory cells in a target block among the plurality of memory blocks, and a read protection controller configured to control the peripheral circuit to perform a read protection operation of limiting the read operation on memory blocks, among the plurality of memory blocks, corresponding to a read protection command received from a memory controller.

An embodiment of the present disclosure may provide for a method of operating a memory device. The method may include receiving a read protection command from a memory controller, backing up bad block information indicating information regarding memory blocks determined to be bad blocks, and setting a plurality of memory blocks as the bad blocks.

An embodiment of the present disclosure may provide for a memory device. The memory device may include a bad block setting circuit configured to block access to memory blocks that are set as bad blocks, among a plurality of memory blocks, a bad block information controller configured to control the bad block setting circuit to generate, in response to a command received from a memory controller, bad block information indicating information regarding the memory blocks that are set as the bad blocks before the command is received, a register configured to receive the bad block information from the bad block setting circuit and save the bad block information, and a bad block setter configured to control the bad block setting circuit to set the plurality of memory blocks as the bad blocks in response to the command.

DETAILED DESCRIPTION

Specific structural or functional descriptions in the embodiments of the present disclosure introduced in this specification or application are provided as examples to describe embodiments according to the concept of the present disclosure. The embodiments according to the concept of the present disclosure may be practiced in various forms, and should not be construed as being limited to the embodiments described in the specification or application.

Various embodiments of the present disclosure are directed to a memory device that supports an improved read protection operation and a method of operating the memory device.

Figure 1:
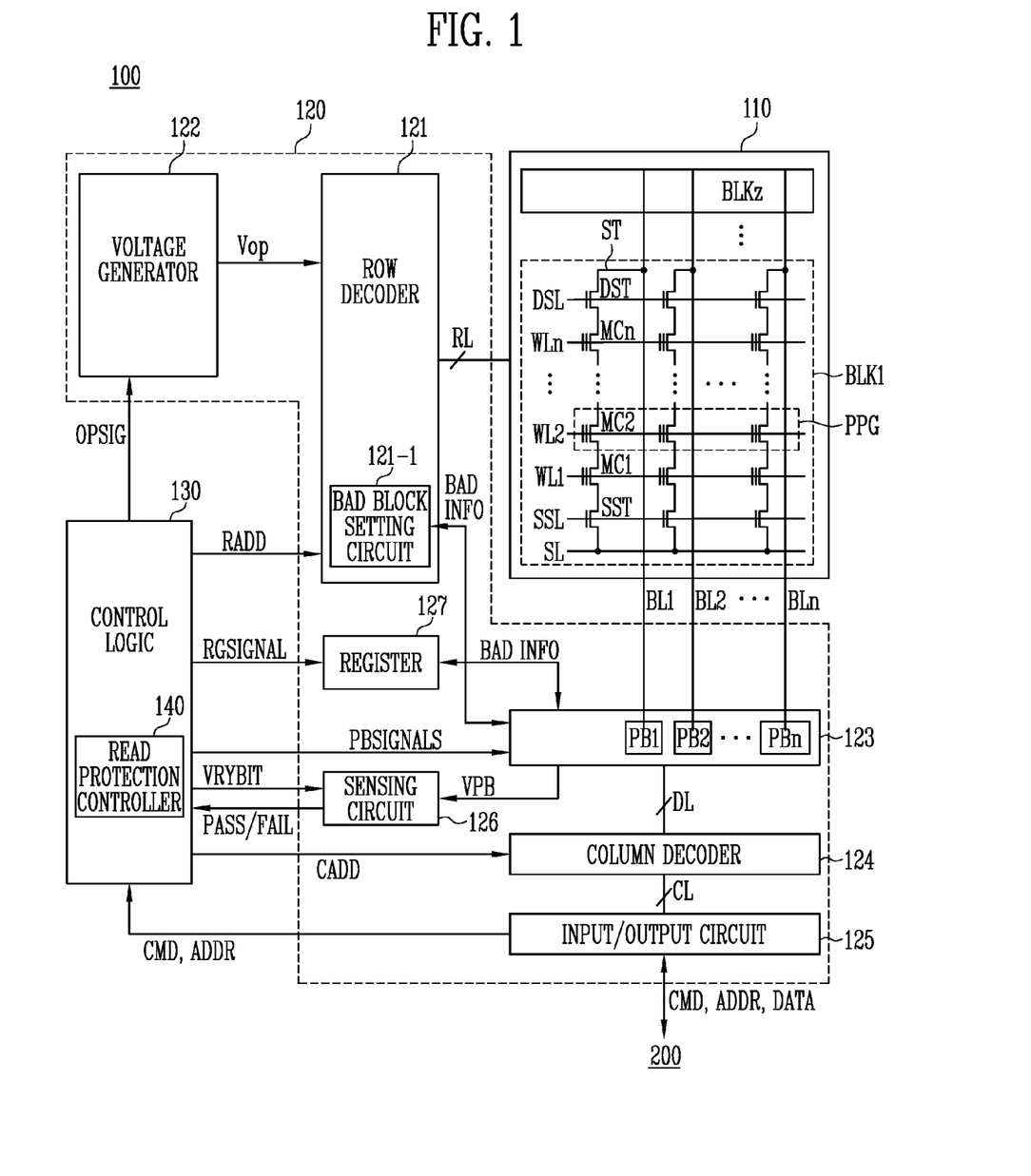
FIG. 1 is a block diagram illustrating a memory device according to an embodiment of the present disclosure.

FIG. 1 is a block diagram illustrating a memory device according to an embodiment of the present disclosure.

Referring to FIG. 1, a memory device 100 may include a memory cell array 110, a peripheral circuit 120, and a control logic 130.

The memory cell array 110 may include a plurality of memory blocks BLK1 to BLKz.

The plurality of memory blocks BLK1 to BLKz may be coupled to a row decoder 121 through row lines RL. Here, the row lines RL may include the at least one source select line SSL, a plurality of word lines WL1 to WLn, and at least one drain select line DSL. In an embodiment, the word lines may include normal word lines and dummy word lines. Further, the row lines RL may further include a pipe select line.

Each of the plurality of memory blocks BLK1 to BLKz may include a plurality of memory cell strings ST coupled between the bit lines BL1 to BLn and a source line SL. Each of the memory blocks BLK1 to BLKz may be coupled to a page buffer group 123 through bit lines BL1 to BLn. The bit lines BL1 to BLn may be coupled to the memory cell strings ST, respectively, and the source line SL may be coupled in common to the memory cell strings ST. The memory cell string ST may include at least one source select transistor SST, a plurality of memory cells MC1 to MCn, and at least one drain select transistor DST that are coupled in series to each other between the source line SL and the bit lines BL1 to BLn.

Each of the memory blocks BLK1 to BLKz may include a plurality of memory cells MC1 to MCn. In an embodiment, the plurality of memory cells may be nonvolatile memory cells. Memory cells coupled to the same word line may be defined as one page (PPG). Therefore, one memory block may include a plurality of pages (PPG). In an embodiment, the page (PPG) may be the unit by which data is stored in the memory device 100 or the unit by which data stored in the memory device 100 is read.

The peripheral circuit 120 may perform a program operation, a read operation, or an erase operation on a selected area of the memory cell array 110 under the control of the control logic 130. The peripheral circuit 120 may include the row decoder 121, a voltage generator 122, the page buffer group 123, a column decoder 124, an input/output circuit 125, a sensing circuit 126, and a register 127.

The row decoder 121 may be coupled to the memory cell array 110 through the row lines RL. The row decoder 121 may decode a row address RADD received from the control logic 130. The row decoder 121 may select at least one of the memory blocks BLK1 to BLKz according to the decoded row address RADD. Further, the row decoder 121 may select at least one word line of the selected memory block so that voltages generated by the voltage generator 122 are applied to the at least one word line according to the decoded address.

During a read operation, the row decoder 121 may apply a read voltage to a selected word line and may apply a read pass voltage that is higher than the read voltage to unselected word lines.

In an embodiment, the row decoder 121 may include a bad block setting circuit 121-1.

The bad block setting circuit 121-1 may be a circuit for blocking access to bad blocks by setting bad blocks. The bad block setting circuit 121-1 may store bad block information BAD INFO regarding information about memory blocks previously determined to be bad blocks. The bad block setting circuit 121-1 may provide the bad block information BAD INFO to the page buffer group 123 or may receive the bad block information BAD INFO from the page buffer group 123. The bad block setting circuit 121-1 will be described in detail later with reference to FIG. 4.

The voltage generator 122 may generate a plurality of voltages using an external supply voltage provided to the memory device 100. For example, the voltage generator 122 may generate various operating voltages Vop that are used for program, read, and erase operations in response to an operation signal OPSIG. Also, the plurality of generated voltages may be supplied to the memory cell array 110 by the row decoder 121.

The page buffer group 123 may include first to n-th page buffers PB1 to PBn. The first to n-th page buffers PB1 to PBn may temporarily store data received through the first to n-th bit lines BL1 to BLn in response to page buffer control signals PBSIGNALS or may sense voltages or currents of the bit lines BL1 to BLn during a read or verify operation.

During a read operation, the first to n-th page buffers PB1 to PBn may read data DATA from the memory cells in the selected page through the first to n-th bit lines BL1 to BLn and may output the read data DATA to the input/output circuit 125 under the control of the column decoder 124.

In an embodiment, the page buffer group 123 may provide/receive bad block information BAD INFO to/from the bad block setting circuit 121-1. Further, the page buffer group 123 may provide/receive the bad block information BAD INFO to/from the register 127, the page buffer group 123 providing the bad block information BAD INFO, received from the register 127, to the bad block setting circuit 121-1.

The column decoder 124 may transfer data between the input/output circuit 125 and the page buffer group 123 in response to a column address CADD. For example, the column decoder 124 may exchange data with the first to n-th page buffers PB1 to PBn through data lines DL or may exchange data with the input/output circuit 125 through column lines CL.

The input/output circuit 125 may transfer commands CMD and addresses ADDR, received from the memory controller 200, to the control logic 130 or may exchange the data DATA with the column decoder 124. For example, the memory controller 200 may generate various commands CMD and addresses ADDR required for various types of operations in response to requests received from a host or an external device and may transfer the commands and the addresses to the input/output circuit 125.

During a read operation or a verify operation, the sensing circuit 126 may generate a reference current in response to an enable bit signal VRYBIT and may compare a sensing voltage VPB received from the page buffer group 123 with a reference voltage generated by the reference current and then may output a pass signal PASS or a fail signal FAIL.

The register 127 may save the bad block information BAD INFO or may output the bad block information BAD INFO to the page buffer group 123 in response to a register control signal RGSIGNAL.

The control logic 130 may control the peripheral circuit 120 by outputting the operation signal OPSIG, the row address RADD, the page buffer control signals PBSIGNALS, and the enable bit signal VRYBIT in response to the commands CMD and the addresses ADDR.

Further, the control logic 130 may determine whether the verify operation has passed or failed in response to the pass or fail signal PASS or FAIL. Also, the control logic 130 may control the page buffer group 123 so that verify information including the pass or fail signal PASS or FAIL is temporarily stored in the page buffer group 123. In detail, the control logic 130 may determine the program state of each memory cell in response to the pass or fail signal PASS or FAIL. For example, when each memory cell functions as a triple-level cell (TLC), the control logic 130 may determine whether the program state of the corresponding memory cell is an erase state E or any one of first to seventh program states P1 to P7.

In accordance with an embodiment of the present disclosure, the control logic 130 may include a read protection controller 140.

The read protection controller 140 may control the peripheral circuit 120 to perform a read protection operation in response to the read protection command received from the memory controller 200. The read protection operation may be an operation of limiting a read operation on memory blocks, among the plurality of memory blocks, corresponding to the read protection command. The read protection operation will be described in detail later with reference to FIG. 3.

Furthermore, the read protection controller 140 may control the peripheral circuit 120 to terminate the read protection operation of limiting the read operation in response to a protection off command received from the memory controller 200. The operation of terminating the read protection operation will be described in detail later with reference to FIG. 5.

Meanwhile, a device including the memory device 100 and the memory controller 200 may be referred to as a 'storage device.'

Figure 2:
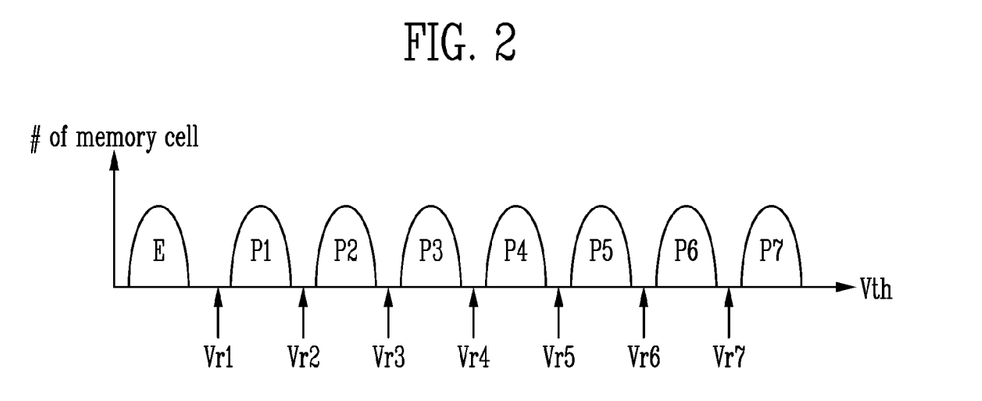
FIG. 2 is a diagram illustrating a read operation according to an embodiment of the present disclosure.

FIG. 2 is a diagram illustrating a read operation according to an embodiment of the present disclosure.

Referring to FIG. 2, memory cells in an erase state E or first to seventh program states P1 to P7 may be distinguished from each other using a plurality read voltages.

The read operation may be an operation in which the memory device 100 reads data from an area selected by an address. In detail, the read operation may include a sensing operation of applying a read voltage to each memory cell, checking the state of current flowing through the memory cell depending on the applied read voltage, and then identifying whether the memory cell is an on-cell or an off-cell.

During the sensing operation, the memory device 100 may set a read voltage based on the threshold voltage values of the memory cells and may identify, using the set read voltage, whether the memory cells are on-cells or off-cells. In detail, the erase state E and the first program state P1 may be identified as an on-cell and an off-cell, respectively, using a first read voltage Vr1. The first program state P1 and the second program state P2 may be identified as an on-cell and an off-cell, respectively, using a second read voltage Vr2. The second program state P2 and the third program state P3 may be identified as an on-cell and an off-cell, respectively, using a third read voltage Vr3. The third program state P3 and the fourth program state P4 may be identified as an on-cell and an off-cell, respectively, using a fourth read voltage Vr4. The fourth program state P4 and the fifth program state P5 may be identified as an on-cell and an off-cell, respectively, using a fifth read voltage Vr5. The fifth program state P5 and the sixth program state P6 may be identified as an on-cell and an off-cell, respectively, using a sixth read voltage Vr6. The sixth program state P6 and the seventh program state P7 may be identified as an on-cell and an off-cell, respectively, using a seventh read voltage Vr7. That is, during the sensing operation, the memory device 100 may set the level of the read voltage to a level that is higher than the maximum value of the distribution of on-cells desired to be identified and may set the level of the read voltage to a level that is lower than the minimum value of the distribution of off-cells, thus identifying whether memory cells are on-cells or off-cells.

Furthermore, a read operation may include a decoding operation of identifying an on-cell distribution and an off-cell distribution of a plurality of memory cells from each other and converting the identified distributions of the memory cells into data. In detail, the memory device 100 may identify the distribution of a specific memory cell by applying the first to seventh read voltages Vr1 to Vr7 to the specific memory cell. For example, in the case in which the specific memory cell is programmed to the fourth program state P4, the specific memory cell may be sensed as an off-cell when the first to fourth read voltages are applied to the specific memory cell and may be sensed as an on-cell when the fifth to seventh read voltages are applied thereto. Furthermore, the memory device 100 may identify that the specific memory cell is programmed to the fourth program state P4 by combining the results of sensing. The memory device 100 may identify the program states of the plurality of memory cells using the same method and may convert the program states into data by combining the identified program states.

However, during the sensing operation, when a read voltage by which it is difficult to identify whether memory cells are on-cells or off-cells is applied, a read fail in which the result of the read operation is not reliable may occur. For example, when a program operation is performed on a memory cell adjacent to the specific memory cell, the threshold voltage distribution of the specific memory cell may be shifted due to programmed memory cells, and a read fail may occur. Alternatively, when a read operation is performed in the state in which memory cells adjacent to the specific memory cell are programmed, an applied voltage level may be lower than the maximum value of the on-cell distribution or may be higher than the minimum value of the off-cell distribution, and read fail may occur even if a read voltage is normally applied to a target word line.

Figure 3:
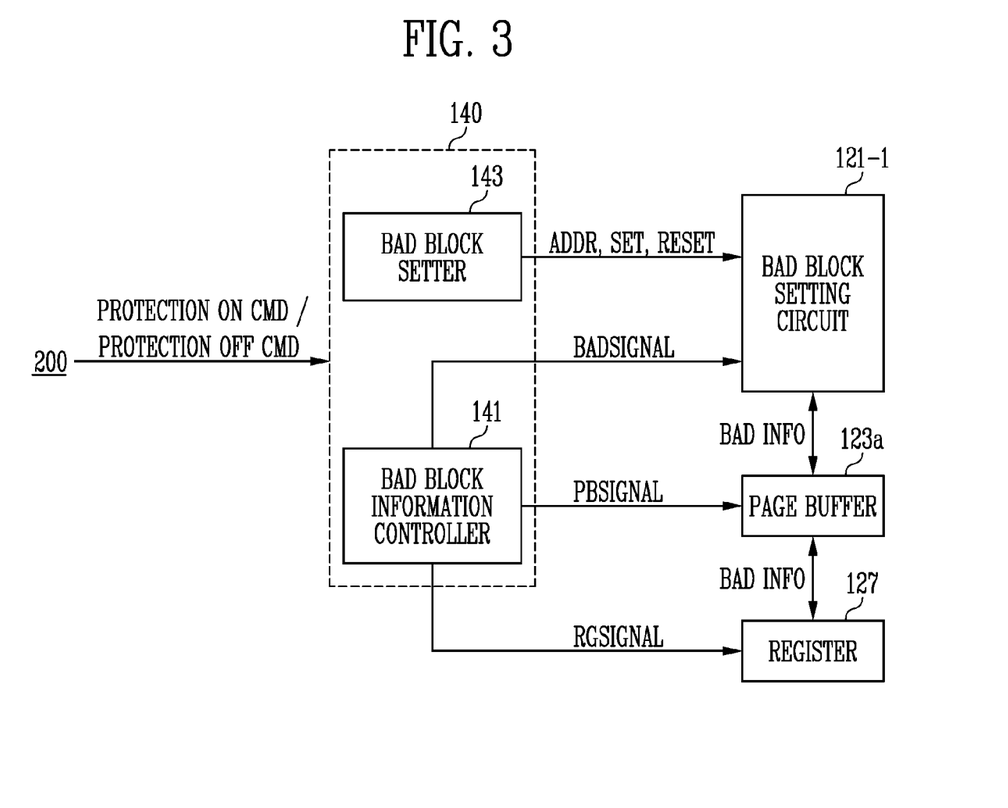
FIG. 3 is a diagram illustrating a read protection controller according to an embodiment of the present disclosure.

FIG. 3 is a diagram illustrating a read protection controller according to an embodiment of the present disclosure.

Referring to FIG. 3, the read protection controller 140 may include a bad block information controller 141 and a bad block setter 143. In an embodiment, each of the read protection controller 140, the bad block information controller 141 and the bad block setter 143 may be implemented using hardware, software, or a combination of hardware and software. For example, each of the read protection controller 140, the bad block information controller 141 and the bad block setter 143 may be a circuit or a processor operating based on an algorithm, or a processor for executing code. The bad block information controller 141 may control the peripheral circuit 120 to back up bad block information BAD INFO to a register 127 or to load the bad block information from the register 127.

In an embodiment, the bad block information controller 141 may control the bad block information BAD INFO included in a bad block setting circuit 121-1 to be saved in the register 127 through a page buffer in response to a read protection command PROTECTION ON CMD. Here, a page buffer 123a may be any one of the first to n-th page buffers PB1 to PBn, illustrated in FIG. 1.

In detail, the bad block information controller 141 may output a bad block information control signal BADSIGNAL, which controls the bad block information BAD INFO included in the bad block setting circuit 121-1 to be extracted and provided to the page buffer 123a, to the bad block setting circuit 121-1. Further, the bad block information controller 141 may output a page buffer control signal PBSIGNAL, which controls the received bad block information BAD INFO to be provided to the register 127, to the page buffer 123a. Accordingly, the register 127 may save the bad block information BAD INFO.

Here, the bad block information BAD INFO may be information about memory blocks determined to be bad blocks before the read protection command PROTECTION ON CMD is received. Here, the bad block information BAD INFO may include addresses or the like of the memory blocks determined to be bad blocks. In detail, the memory device 100 may determine memory blocks having bad states in a process of performing a program operation, a read operation, or an erase operation, to be bad blocks and then may generate bad block information BAD INFO. Such bad block information BAD INFO may be included in the bad block setting circuit 121-1. That is, the bad block setting circuit 121-1 may perform an operation of setting memory blocks corresponding to the bad block information BAD INFO to bad blocks.

Meanwhile, although, in the above-described example, the bad block information BAD INFO is described as being included in the bad block setting circuit 121-1, the present disclosure is not limited thereto. In an example, the bad block information BAD INFO may be stored in the memory cell array 110. In this case, the read protection controller 140 may read the bad block information BAD INFO from the memory cell array 110, and may provide the bad block information to the register 127. In an example, the bad block information BAD INFO may be stored in the memory controller 200. In this case, the read protection controller 140 may successively receive the read protection command PROTECTION ON CMD and the bad block information BAD INFO from the memory controller 200 and may provide the received bad block information BAD INFO to the register 127.

In an embodiment, the bad block information controller 141 may control the bad block information BAD INFO, saved in the register 127, to be provided to the bad block setting circuit 121-1 through the page buffer 123a in response to a protection off command PROTECTION OFF CMD.

In detail, the bad block information controller 141 may output a register control signal RGSIGNAL, which controls the bad block information BAD INFO that is saved in the register 127 to be provided to the page buffer 123a, to the register 127. Further, the bad block information controller 141 may output the page buffer control signal PBSIGNAL, which controls the received bad block information BAD INFO to be provided to the bad block setting circuit 121-1, to the page buffer 123a. Accordingly, the bad block setting circuit 121-1 may set memory blocks corresponding to the bad block information BAD INFO to bad blocks.

In accordance with an embodiment, the read protection operation may limit a read operation on all memory blocks, and the bad blocks corresponding to the read protection command may be all memory blocks included in the memory device 100. However, it is apparent that the read protection operation may be implemented in a form in which only a read operation on some memory blocks is limited.

The bad block setter 143 may control the peripheral circuit 120 to set bad blocks or initialize (reset) the setting of bad blocks.

In an embodiment, the bad block setter 143 may control the bad block setting circuit 121-1 to set memory blocks corresponding to the read protection command PROTECTION ON CMD to bad blocks.

In detail, after the bad block information BAD INFO is saved in the register 127, the bad block setter 143 may output the addresses ADDR of memory blocks corresponding to the read protection command PROTECTION ON CMD and a bad block set signal SET, which sets memory blocks corresponding to the addresses ADDR to bad blocks, to the bad block setting circuit 121-1. In this case, the bad block set signal SET may be a signal for activating a bad block enable signal for setting memory blocks corresponding to the addresses ADDR to bad blocks.

In an embodiment, the bad block setter 143 may output a bad block reset signal RESET, which resets the setting of bad blocks before the addresses ADDR and the bad block set signal SET are output, to the bad block setting circuit 121-1. The bad block set signal SET, the bad block reset signal RESET, and the bad block setting circuit 121-1 will be described in detail later with reference to FIG. 4.

In an embodiment, the bad block setter 143 may control the bad block setting circuit 121-1 to set again memory blocks, previously determined to be bad blocks, to bad blocks in response to a protection off command PROTECTION OFF CMD.

In detail, the bad block setter 143 may output the bad block reset signal RESET to the bad block setting circuit 121-1 in response to the protection off command PROTECTION OFF CMD. Thereafter, when the bad block setting circuit 121-1 receives the bad block information BAD INFO, saved in the register 127 through the page buffer 123a, the bad block setter 143 may output the bad block set signal SET to the bad block setting circuit 121-1. Accordingly, the bad block setting circuit 121-1 may reestablish the setting of bad blocks that were previously set based on the address included in the bad block information BAD INFO and the bad block set signal SET.

Figure 4:
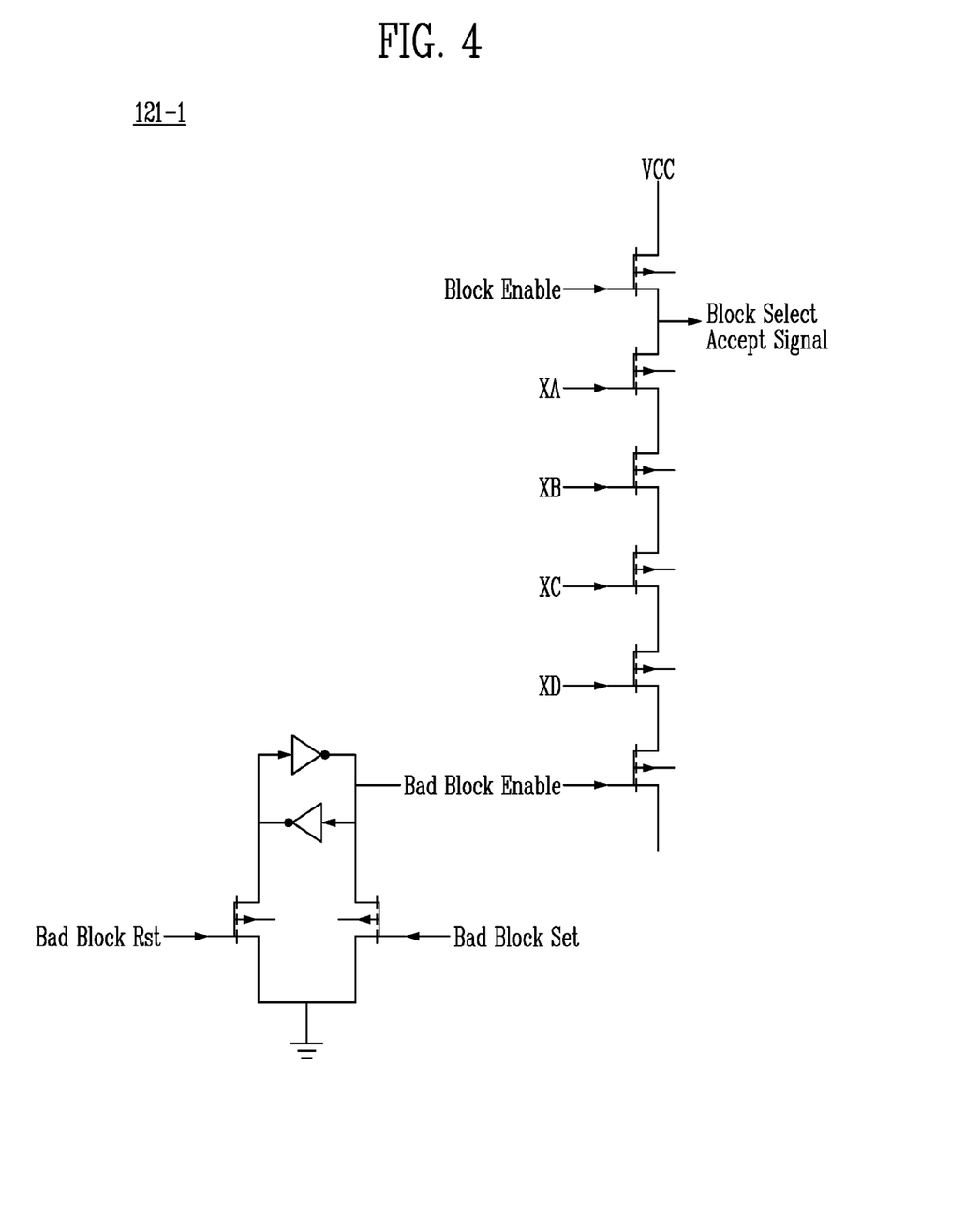
FIG. 4 is a diagram illustrating a bad block setting circuit according to an embodiment of the present disclosure.

FIG. 4 is a diagram illustrating a bad block setting circuit according to an embodiment of the present disclosure.

The bad block set signal Bad Block Set and the bad block reset signal Bad Block Rst of FIG. 4 may be the bad block set signal SET and the bad block reset signal RESET of FIG. 3.

Referring to FIG. 4, the memory device 100 may perform a read protection operation using the bad block setting circuit 121-1. The read protection operation may include a switching operation of preventing the voltage of a global word line from being transferred to a local word line using a row decoder 121. Here, the switching operation may be an operation of turning on/off a switch circuit so that a block word line voltage is not applied to memory blocks corresponding to a read protection command.

A signal XA, a signal XB, a signal XC, and a signal XD may be address signals applied in response to a specific address. In detail, the signal XA may be a first block address signal for dividing memory blocks into a plurality of first sub-block groups, and the signal XB may be a second block address signal for dividing the first sub-block groups into a plurality of second sub-block groups. Further, the signal XC may be a third block address signal for dividing the second sub-block groups into a plurality of third sub-block groups, and the signal XD may be a fourth block address signal for dividing the third sub-block groups into a plurality of fourth sub-block groups. For example, when an address is received from the bad block setter 143, the bad block setting circuit 121-1 may activate one or more of the signal XA, the signal XB, the signal XC, and the signal XD depending on the received address. Meanwhile, when the address received from the bad block setter 143 indicates all memory blocks, the bad block setting circuit 121-1 may activate all of the signals XA, XB, XC, and XD.

A block enable signal Block Enable and a block select accept signal Block Select Accept may be signals indicating the selection of a memory block in response to a specific address. When the block select accept signal Block Select Accept is output at a high level, the circuit having received the block select accept signal Block Select Accept may generate a block selection signal for selecting a memory block corresponding to the address signal from among the plurality of memory blocks. A memory block may be selected in response to the block selection signal, and the voltage of the global word line may be transferred to the local word line of the selected memory block. When the block select accept signal Block Select Accept is output at low level, the voltage of the global word line might not be transferred to the local word line of the selected memory block, and none of the blocks may be decoded.

In accordance with an embodiment, when the bad block set signal Bad Block Set is input from the bad block setter 143, the bad block setting circuit 121-1 may output a bad block enable signal Bad Block Enable at high level. When the bad block enable signal Bad Block Enable is output at high level, the bad block setting circuit 121-1 may be connected to a ground potential, and thus, the block select accept signal Block Select Accept may be output at a low level. That is, a memory block corresponding to the address signal may be set as a bad block. In this case, a block word line voltage may be blocked without being applied to the memory block that is set as the bad block.

In accordance with an embodiment, when the bad block reset signal Bad Block Rst is input from the bad block setter 143, the bad block setting circuit 121-1 may output the bad block enable signal Bad Block Enable at a low level. When the bad block enable signal Bad Block Enable is output at a low level, the bad block setting circuit 121-1 might not be connected to a ground potential, and thus, the block select accept signal Block Select Accept may be output at a high level. That is, the memory block may be released from a bad block.

Figure 5:
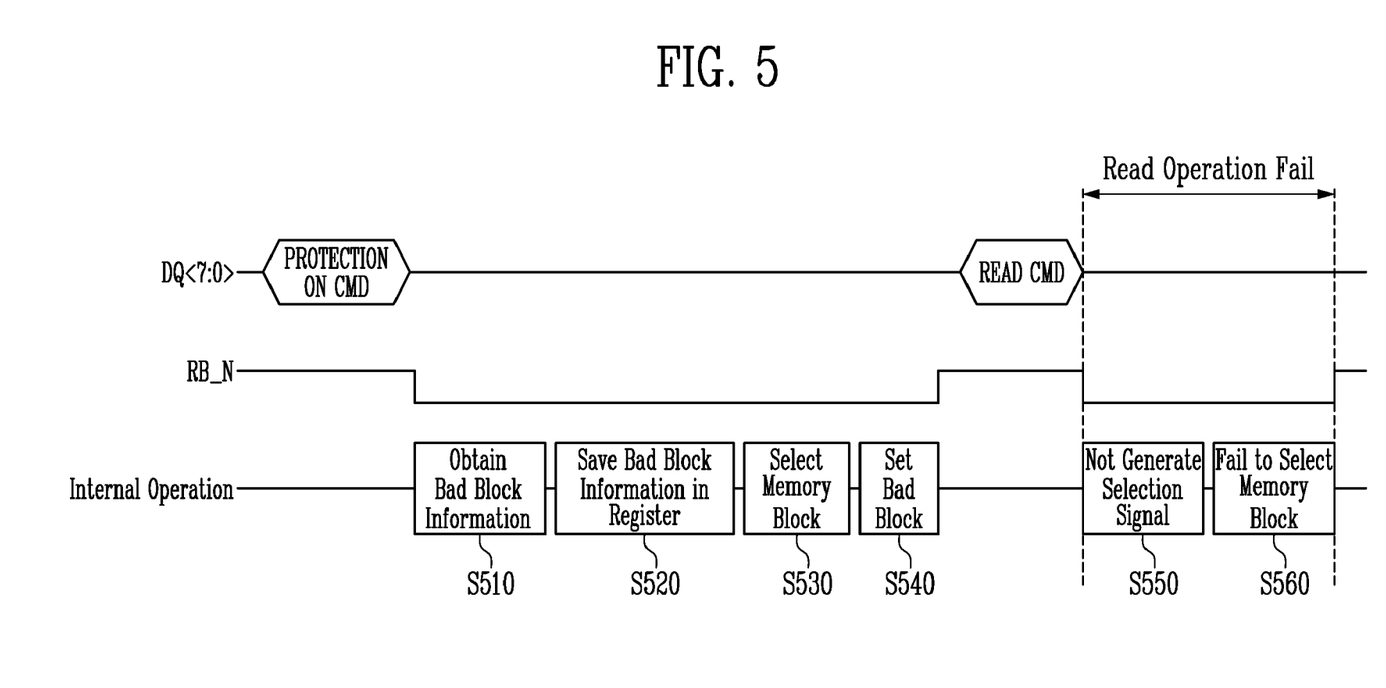
FIG. 5 is a diagram illustrating a read protection operation according to an embodiment of the present disclosure.

FIG. 5 is a diagram illustrating a read protection operation according to an embodiment of the present disclosure.

Referring to FIG. 5, a method in which the memory device 100 may perform a read protection operation is illustrated over time. The memory device 100 may receive a command from the memory controller 200 through input/output terminals DQ<7:0>. A ready/busy signal RB_N may be output at low level while an operation corresponding to the command is performed, thus indicating that the memory device is in a busy state. When the operation corresponding to the command is completed, the ready/busy signal RB_N may be output at high level, thus indicating that the memory device is in a ready state.

The memory device 100 may receive a read protection command PROTECTION ON CMD from the memory controller 200. Also, the memory device 100 may perform a read protection operation in response to the read protection command PROTECTION ON CMD.

In detail, the memory device 100 may obtain bad block information from the bad block setting circuit 121-1 at step S510. For example, the bad block setting circuit 121-1 may generate bad block information based on the current bad block setting state. That is, the bad block information may include information regarding memory blocks set as bad blocks on the bad block setting circuit 121-1 at a time point at which the read protection command PROTECTION ON CMD is received.

Further, the memory device 100 may save the bad block information in the register 127 at step S520. For example, the bad block setting circuit 121-1 may provide the bad block information to the page buffer 123*a*, and the page buffer 123*a* may provide the received bad block information to the register 127. That is, the memory device 100 may back up the bad block information before memory blocks are set as bad blocks through obtainment and storage of the bad block information.

Furthermore, the memory device 100 may select memory blocks corresponding to the read protection command PROTECTION ON CMD at step S530. Here, the memory blocks corresponding to the read protection command PROTECTION ON CMD may be some or all of the plurality of memory blocks. For example, the read protection controller 140 may provide the address of memory blocks corresponding to the read protection command PROTECTION ON CMD to the bad block setting circuit 121-1. Accordingly, the bad block setting circuit 121-1 may check memory blocks to be set as bad blocks.

Furthermore, the memory device 100 may set the memory blocks corresponding to the read protection command PROTECTION ON CMD to bad blocks at step S540. For example, the read protection controller 140 may output a bad block set signal to the bad block setting circuit 121-1. The bad block setting circuit 121-1 may set the selected memory blocks to bad blocks by activating a bad block enable signal based on the bad block set signal. Accordingly, a read operation on the selected memory blocks may be limited.

Thereafter, the memory device 100 may receive a read command READ CMD from the memory controller 200. Here, because the read protection operation has been completed, the memory device 100 may limit a read operation on the memory blocks that are set as bad blocks even if the read command READ CMD is received. That is, even if an address signal for the read operation is applied, the block selection signal might not be generated, and the voltage of the global word line cannot be transferred to the local word line. Accordingly, the memory device 100 might not generate a block selection signal for selecting a memory block at step S550 and may fail to select a memory block on which a read operation is to be performed at step S560.

Figure 6:
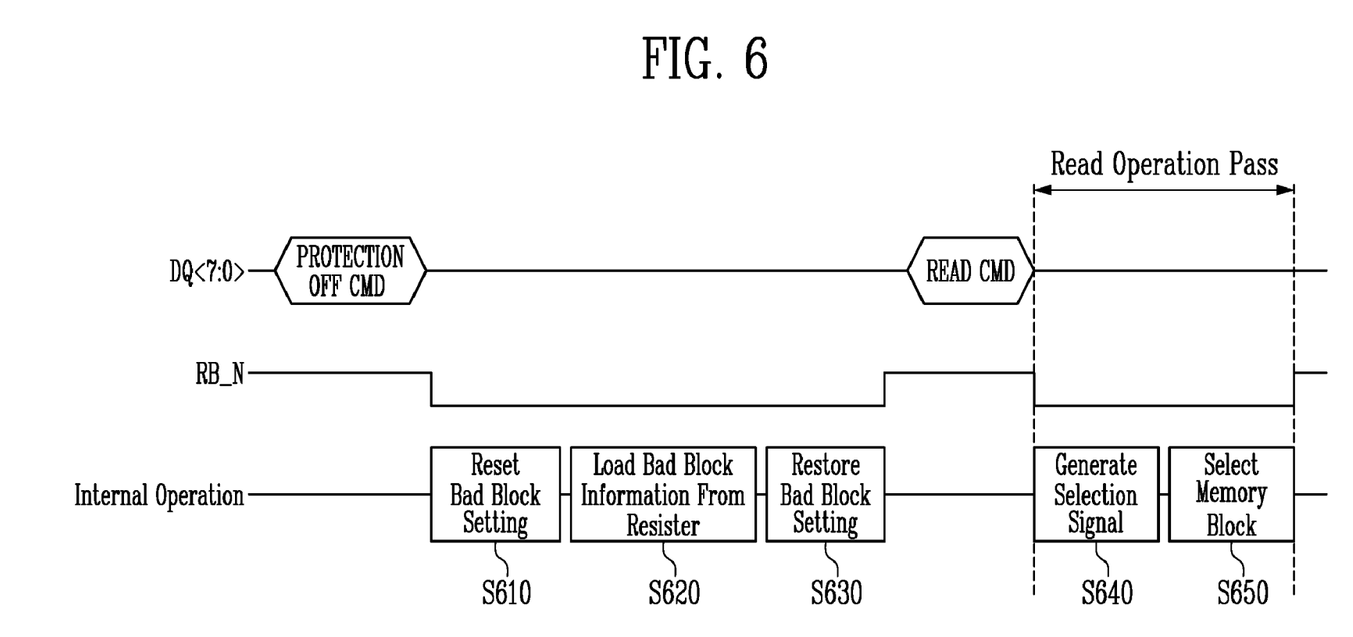
FIG. 6 is a diagram illustrating a read protection off operation according to an embodiment of the present disclosure.

FIG. 6 is a diagram illustrating a read protection off operation according to an embodiment of the present disclosure.

Referring to FIG. 6, a method in which the read protection operation of the memory device 100 is turned off is illustrated over time. The memory device 100 may receive a command from the memory controller 200 through input/output terminals DQ<7:0>. A ready/busy signal RB_N may be output at a low level while an operation corresponding to the command is performed, thus indicating that the memory device is in a busy state. When the operation corresponding to the command is completed, the ready/busy signal RB_N may output at a high level, thus indicating that the memory device is in a ready state.

The memory device 100 may receive a command PROTECTION OFF CMD for instructing a read protection operation to be turned off from the memory controller 200. Further, the memory device 100 may perform a read protection off operation in response to the protection off command PROTECTION OFF CMD.

In detail, the memory device 100 may reset (initialize) the setting of bad blocks by the bad block setting circuit 121-1 at step S610. For example, the read protection controller 140 may output a bad block reset signal to the bad block setting circuit 121-1. The bad block setting circuit 121-1 may reset the setting of bad blocks. Accordingly, the bad blocks set for all memory blocks may be released.

Further, the memory device 100 may load the bad block information from the register 127 at step S620. For example, the register 127 may provide the stored bad block information to the page buffer 123*a*, and the page buffer 123*a* may provide the received bad block information to the bad block setting circuit 121-1.

The memory device 100 may reestablish the setting of the bad block based on the bad block information at step S630. For example, the read protection controller 140 may output a bad block set signal to the bad block setting circuit 121-1. The bad block setting circuit 121-1 may set bad blocks based on the received bad block information. Accordingly, setting of bad blocks, made by the bad block setting circuit 121-1 before the read protection command is received, may be reestablished.

Thereafter, the memory device 100 may receive a read command READ CMD from the memory controller 200. In this case, because the read protection off operation has been completed, the memory device 100 may normally perform a read operation corresponding to the read command READ CMD. That is, when an address signal for the read operation is applied, a block selection signal may be generated, and the voltage of a global word line may be transferred to a local word line. Accordingly, the memory device 100 may generate the block selection signal for selecting a memory block at step S640 and may select a memory block on which a read operation is to be performed at step S650.

Figure 7:
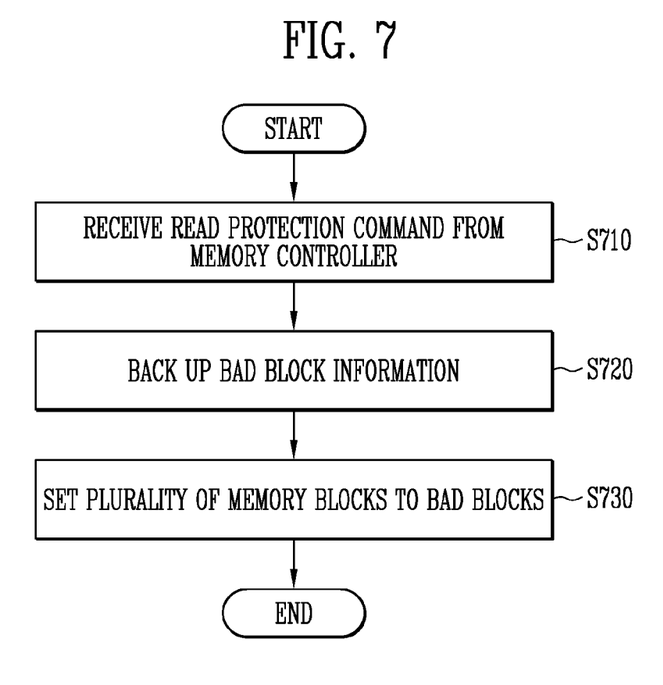
FIG. 7 is a flowchart illustrating a method of operating a memory device according to an embodiment of the present disclosure.

FIG. 7 is a flowchart illustrating a method of operating a memory device according to an embodiment of the present disclosure.

Referring to FIG. 7, a method for operating a memory device including a plurality of memory blocks is illustrated.

First, the memory device 100 may receive a read protection command from the memory controller 200 at step S710. Here, the read protection command may be a command for instructing a read protection operation of limiting a read operation to be performed.

Further, the memory device 100 may back up bad block information at step S720. In detail, the memory device 100 may obtain bad block information based on memory blocks that are set as bad blocks at a time point at which the read protection command is received. Also, the memory device 100 may save the bad block information in a register.

Furthermore, the memory device 100 may set a plurality of memory blocks to bad blocks at step S730. For example, the memory device 100 may generate a bad block enable signal for setting the plurality of memory blocks to bad blocks based on the address of the plurality of memory blocks and a bad block set signal. Thereafter, the memory device 100 may block a block word line voltage to be applied to the plurality of memory blocks when a read command is received from the memory controller 200.

In accordance with an embodiment of the present disclosure, the memory device 100 may receive a protection off command from the memory controller 200 and may reestablish the setting of the bad blocks, which was made before receiving the read protection command, based on the backed-up bad block information. Further, the memory device 100 may reset the setting of the plurality of memory blocks as the bad blocks. In detail, the memory device 100 may deactivate the bad block enable signal based on the bad block reset signal in response to a protection off command.

Figure 8:
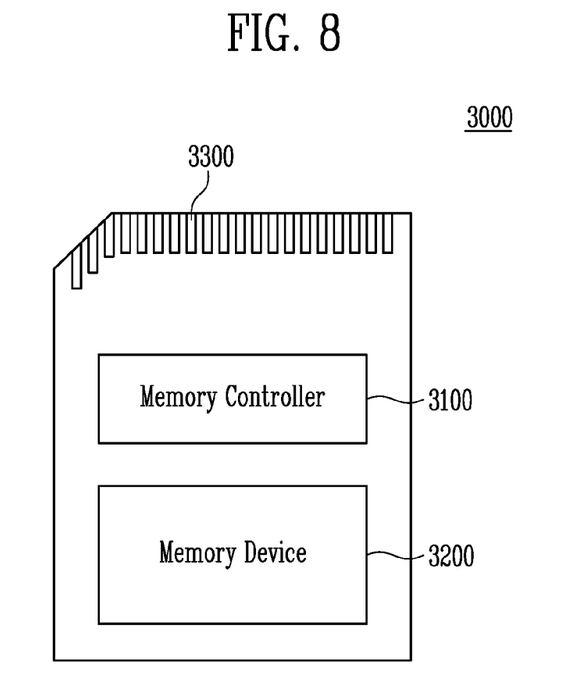
FIG. 8 is a diagram illustrating a memory card system according to an embodiment of the present disclosure.

FIG. 8 is a diagram illustrating a memory card system according to an embodiment of the present disclosure.

Referring to FIG. 8, a memory card system 3000 may include a memory controller 3100, a memory device 3200, and a connector 3300.

The memory controller 3100 may be electrically connected to the memory device 3200, and may access the memory device 3200. For example, the memory controller 3100 may control read, write, erase, and background operations of the memory device 3200. The memory controller 3100 may provide an interface between the memory device 3200 and a host. The memory controller 3100 may be the memory controller 200 of FIG. 1.

The memory controller 3100 may communicate with an external device through the connector 3300. The memory controller 3100 may communicate with an external device (e.g., a host) based on a specific communication standard. In an embodiment, the connector 3300 may be defined by at least one of various communication standards.

In an embodiment, the memory device 3200 may be implemented as any of various nonvolatile memory devices, such as an electrically erasable and programmable ROM (EEPROM), a NAND flash memory, a NOR flash memory, a phase-change RAM (PRAM), a resistive RAM (ReRAM), a ferroelectric RAM (FRAM), and a spin transfer torque magnetic RAM (STT-MRAM).

The memory controller 3100 and the memory device 3200 may be integrated into a single semiconductor device to form a memory card. For example, the memory controller 3100 and the memory device 3200 may be integrated into a single semiconductor device to form a memory card, such as a PC card (i.e., personal computer memory card international association: PCMCIA), a compact flash card (CF), a smart media card (SM or SMC), a memory stick, a multimedia card (MMC, RS-MMC, MMCmicro or eMMC), a SD card (SD, miniSD, microSD, or SDHC), or a universal flash storage (UFS).

Figure 9:
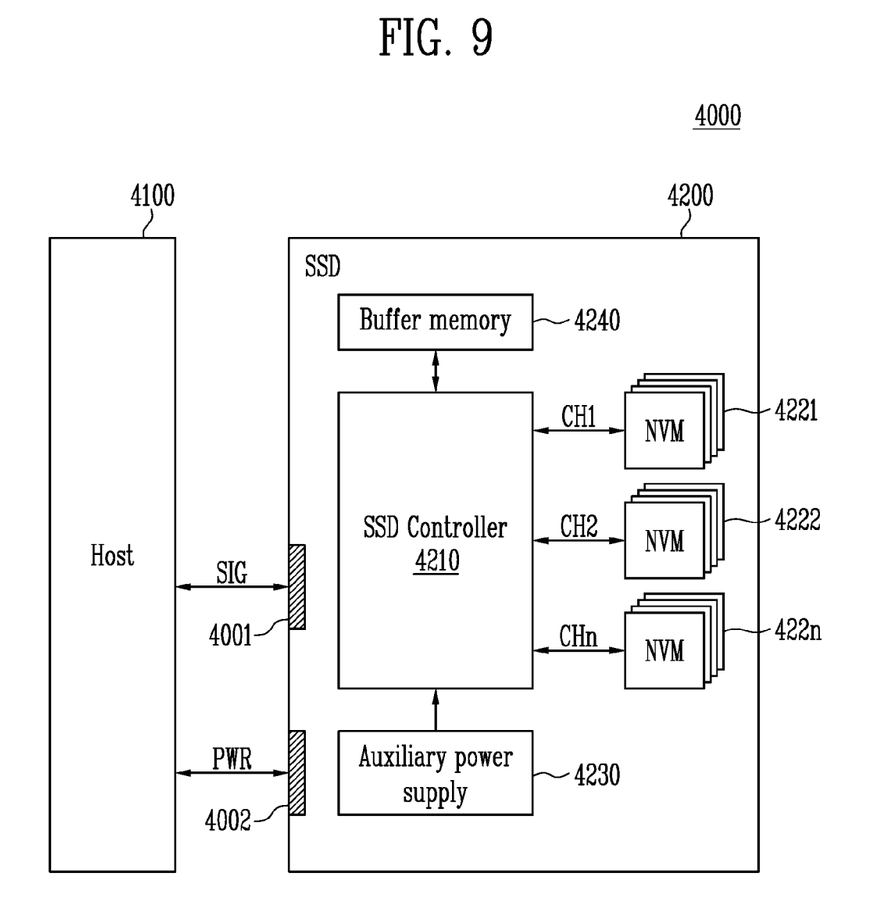
FIG. 9 is a diagram illustrating a solid state drive (SSD) system according to an embodiment of the present disclosure.

FIG. 9 is a diagram illustrating a solid state drive (SSD) system according to an embodiment of the present disclosure.

Referring to FIG. 9, an SSD system 4000 may include a host 4100 and an SSD 4200. The SSD 4200 may exchange a signal SIG with the host 4100 through a signal connector 4001 and may be supplied with power PWR through a power connector 4002. The SSD 4200 may include an SSD controller 4210, a plurality of flash memories 4221 to 422n, an auxiliary power supply 4230, and a buffer memory 4240.

In an embodiment, the SSD controller 4210 may perform a function of the memory controller 3100, described above with reference to FIG. 8. The SSD controller 4210 may control the plurality of flash memories 4221 to 422n in response to the signal SIG received from the host 4100. In an embodiment, the signal SIG may include signals based on the interfaces of the host 4100 and the SSD 4200.

The auxiliary power supply 4230 may be coupled to the host 4100 through the power connector 4002. The auxiliary power supply 4230 may be supplied with power PWR from the host 4100 and may be charged. The auxiliary power supply 4230 may supply the power of the SSD 4200 when the supply of power from the host 4100 is not smoothly performed. In an embodiment, the auxiliary power supply 4230 may be located inside or outside the SSD 4200. For example, the auxiliary power supply 4230 may be located in a main board and may provide auxiliary power to the SSD 4200.

The buffer memory 4240 may function as a buffer memory of the SSD 4200. For example, the buffer memory 4240 may temporarily store data received from the host 4100 or data received from the plurality of flash memories 4221 to 422n or may temporarily store metadata (e.g., mapping tables) of the flash memories 4221 to 422n. The buffer memory 4240 may include volatile memories, such as DRAM, SDRAM, DDR SDRAM, LPDDR SDRAM, and GRAM, or nonvolatile memories, such as FRAM, ReRAM, STT-MRAM, and PRAM.

In accordance with the present disclosure, there are provided a memory device that supports an improved read protection operation and a method of operating the memory device.

What is claimed is:

1. A memory device, comprising:
   a memory cell array including a plurality of memory blocks;

a peripheral circuit configured to perform a read operation of reading data stored in selected memory cells in a target block, among the plurality of memory blocks; and a read protection controller configured to control the peripheral circuit to perform a read protection operation of limiting the read operation on memory blocks, among the plurality of memory blocks, corresponding to a read protection command received from a memory controller, wherein the peripheral circuit, in response to the read protection command, back up bad block information in a register, wherein the bad block information is indicating information regarding memory blocks that are previously determined to be bad blocks before the read command is received, wherein the peripheral circuit, in response to the protection off command, reset setting of bad blocks and reestablishes the setting of bad blocks based on the backed up bad block information in the register.

2. The memory device according to claim 1, wherein the peripheral circuit comprises:

a bad block setting circuit configured to, in response to the read protection command, generate the bad block information;

a page buffer configured to receive the bad block information from the bad block setting circuit; and the register configured to receive the bad block information from the page buffer and save the bad block information.

3. The memory device according to claim 2, wherein the read protection controller is configured to control the bad block setting circuit to set memory blocks, corresponding to the read protection command, as the bad blocks after the bad block information is saved in the register.

4. The memory device according to claim 3, wherein a word line voltage is not applied to the memory blocks that are set as the bad blocks.

5. The memory device according to claim 2, wherein the read protection controller is configured to control the peripheral circuit to terminate the read protection operation in response to a protection off command received from the memory controller.

6. The memory device according to claim 5, wherein the bad block setting circuit receives the bad block information saved in the register through the page buffer and reestablishes the setting of the bad blocks, made before the read protection operation is performed, based on the bad block information.

7. The memory device according to claim 1, wherein the read protection controller is configured to control the peripheral circuit such that, when a read command for any one of the plurality of memory blocks is received after the read protection operation is performed, a memory block corresponding to the read command is not selected.

8. The memory device according to claim 7, wherein the read protection controller is configured to control the peripheral circuit such that the memory block corresponding to the read command is not decoded.

9. The memory device according to claim 1, wherein the memory blocks corresponding to the read protection command include all of the plurality of memory blocks.

10. A method of operating a memory device, comprising:
receiving a read protection command from a memory controller;

backing up bad block information wherein the bad block information is indicating information regarding memory blocks that are previously determined to be bad blocks before the read command is received; and setting a plurality of memory blocks as the bad blocks, receiving a protection off command from the memory controller after the setting of the plurality of memory blocks as the bad blocks; and, reestablishing setting of bad blocks based on the backed up bad block information, in response to the protection off command.

11. The method according to claim 10, wherein the backing up comprises:

obtaining the bad block information based on the memory blocks that are set as the bad blocks at a time point at which the read protection command is received.

12. The method according to claim 11, wherein the backing up further comprises:

saving the bad block information in a register.

13. The method according to claim 10, wherein the setting comprises:

generating a bad block enable signal for setting the plurality of memory blocks as the bad blocks based on an address of the plurality of memory blocks and a bad block set signal.

14. The method according to claim 13, further comprising:

after the setting of the plurality of memory blocks as the bad blocks, when a read command is received from the memory controller, blocking a block word line voltage to be applied to the plurality of memory blocks.

15. The method according to claim 11, further comprising:

before the setting of bad blocks is reestablished, resetting the setting of the plurality of memory blocks as the bad blocks.

16. The method according to claim 15, wherein the resetting comprises:

deactivating a bad block enable signal for setting the plurality of memory blocks as the bad blocks based on a bad block reset signal.

17. A memory device, comprising:

a bad block setting circuit configured to block access to memory blocks that are set as bad blocks, among a plurality of memory blocks;

a bad block information controller configured to control the bad block setting circuit to generate, in response to a read protection command received from a memory controller, bad block information indicating information regarding the memory blocks that are previously set as the bad blocks before the command is received;

a register configured to receive the bad block information from the bad block setting circuit and save the bad block information; and a bad block setter configured to control the bad block setting circuit to set the plurality of memory blocks as the bad blocks in response to the command, wherein the bad block information controller, in response to the read protection command, save the bad block information, and wherein the bad block setter, in response to a protection off command, reset setting of bad blocks and reestablishes setting of bad blocks based on the saved bad block information in the register.

* * * * *